United States Patent
Solayappan et al.

[11] Patent Number: 6,104,049
[45] Date of Patent: Aug. 15, 2000

[54] FERROELECTRIC MEMORY WITH FERROELECTRIC THIN FILM HAVING THICKNESS OF 90 NANOMETERS OR LESS, AND METHOD OF MAKING SAME

[75] Inventors: Narayan Solayappan; Vikram Joshi; Carlos A. Paz de Araujo; Larry D. McMillan, all of Colorado Springs, Colo.; Shinichiro Hayashi; Tatsuo Otsuki, both of Osaka, Japan

[73] Assignee: Symetrix Corporation, Colorado Springs, Colo.

[21] Appl. No.: 09/228,578

[22] Filed: Jan. 11, 1999

Related U.S. Application Data

[63] Continuation-in-part of application No. 08/810,538, Mar. 3, 1997.

[51] Int. Cl.[7] .......................... H01L 29/76; H01L 29/94; H01L 31/062; H01L 31/113; H01L 31/119
[52] U.S. Cl. .............................. 257/295; 257/15; 257/20; 257/22
[58] Field of Search .................................. 257/15, 20, 22, 257/295

[56] References Cited

U.S. PATENT DOCUMENTS

| | | |
|---|---|---|
| 5,046,043 | 9/1991 | Miller et al. |
| 5,198,269 | 3/1993 | Swartz et al. |
| 5,382,817 | 1/1995 | Kashihara et al. ................... 257/295 |
| 5,434,102 | 7/1995 | Watanabe et al. |
| 5,442,585 | 8/1995 | Eguchi et al. ........................... 365/149 |
| 5,519,234 | 5/1996 | Paz de Araujo et al. |
| 5,686,745 | 11/1997 | Lin et al. .................................. 257/295 |
| 5,757,061 | 5/1998 | Satoh et al. ............................. 257/532 |
| 5,821,005 | 10/1998 | Kijima et al. ........................... 428/701 |
| 5,833,745 | 11/1998 | Atsuki et al. ...................... 106/287.18 |

FOREIGN PATENT DOCUMENTS 0 489 519 A2   6/1992   European Pat. Off.

OTHER PUBLICATIONS

Vest et al., "PbTiO3 Films From Metalloorganic Precursors," IEEE Transactions On Ultrasonics, Ferroelectrics, and Frequency Control, vol. 35 (No. 6), p. 711–717 (Nov. 8, 1988).

Batra et al., "Phase Transition, Stability, and Depolarization Field in Ferroelectric Thin Films," Physical Review B, vol. 8 (No. 7), p. 3257–3265 (Oct. 1, 1973).

*Primary Examiner*—Ngân V. Ngô
*Attorney, Agent, or Firm*—Duft, Graziano & Forest, P.C.

[57] ABSTRACT

A coating of liquid precursor containing a metal is applied to a first electrode, baked on a hot plate in oxygen ambient at a temperature not exceeding 300° C. for five minutes, then RTP annealed at 675° C. for 30 seconds. The coating is then annealed in oxygen or nitrogen ambient at 700° C. for one hour to form a thin film of layered superlattice material with a thickness not exceeding 90 nm. A second electrode is applied to form a capacitor, and a post-anneal is performed in oxygen or nitrogen ambient at a temperature not exceeding 700° C. If the material is strontium bismuth tantalate, the precursor contains u mole-equivalents of strontium, v mole-equivalents of bismuth, and w mole-equivalents of tantalum, where $0.8 \leq u \leq 1.0$, $2.0 \leq v \leq 2.3$, and $1.9 \leq w \leq 2.1$.

11 Claims, 6 Drawing Sheets

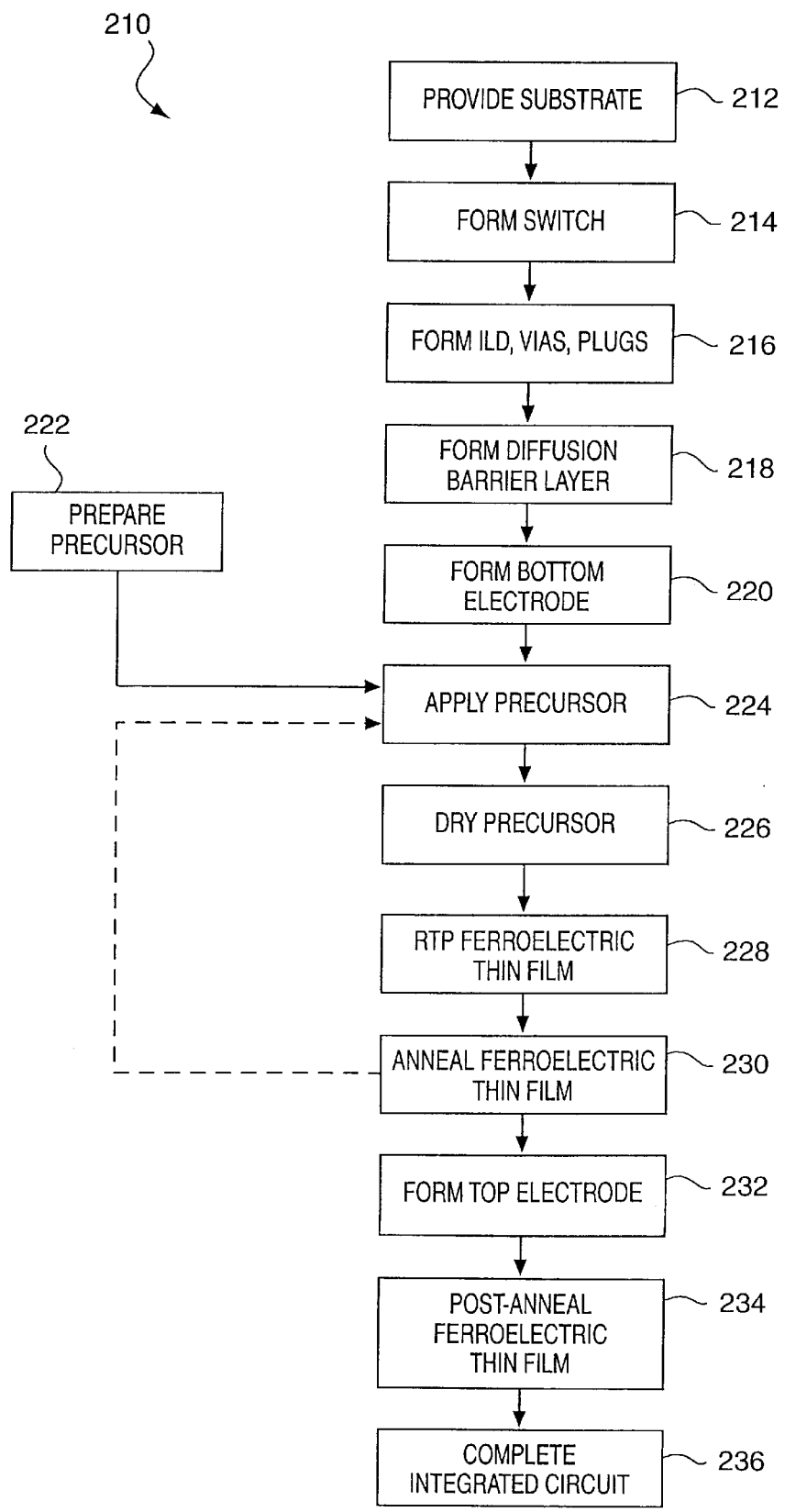

FERROELECTRIC MEMORY WITH FERROELECTRIC THIN FILM HAVING THICKNESS OF 90 NANOMETERS OR LESS, AND METHOD OF MAKING SAME

This application is a continuation-in-part of U.S. patent application Ser. No. 08/810,538 filed Mar. 3, 1997.

BACKGROUND OF THE INVENTION

1. Field of the Invention

The invention in general relates to ferroelectric memories having a thin film of ferroelectric layered superlattice material with a thickness of 90 nanometers or less, and to a method of fabricating such thin films.

2. Statement of the Problem

Ferroelectric compounds possess favorable characteristics for use in nonvolatile integrated circuit memories. See Miller, U.S. Pat. No. 5,046,043. A ferroelectric device, such as a capacitor, is useful as a nonvolatile memory when it possesses desired electronic characteristics, such as high residual polarization, good coercive field, high fatigue resistance, and low leakage current. Layered superlattice material oxides have been studied for use in integrated circuits. See Watanabe, U.S. Pat. No. 5,434,102. Layered superlattice materials exhibit characteristics in ferroelectric memories that are orders of magnitude superior to alternative types of ferroelectric materials, such as PZT and PLZT compounds. Integrated circuit devices containing ferroelectric elements with layered superlattice materials are currently being manufactured. The layered superlattice materials comprise metal oxides.

It is highly desirable that a ferroelectric memory be dense; that is, that there be a high number of memory cells in a given chip volume. To achieve maximum density, the individual elements of the memory should be as small as possible. This requires that the films of ferroelectric material be as thin as possible.

Nevertheless, it is generally known in the art that as a ferroelectric film is made thinner, its critical electronic properties, particularly the ferroelectric polarizability, deteriorate. See Batra et al., "Phase Transition, Stability, and Depolarization Field in Ferroelectric Thin Films", *Physical Review*, Vol. 8, No. 7, pp. 3257–3265 (October 1973), at page 3261, bottom of first column and top of second column, FIG. 4, and page 3265, last sentence of Section IV. Conclusion. The theoretical analysis of Batra et al. has been shown to be correct by experiment. See, for example, Robert W. Vest and Jiejie XU, "$PbTiO_3$ Films From Metalloorganic Precursors", *IEEE Transactions On Ultrasonics, Ferroelectrics, and Frequency Control*, Vol, 13, No. 6, November 1998, page 711, col. 1, first paragraph, and page 714, last paragraph. See also U.S. Pat. No. 5,519,234, issued May 21, 1996 to Carlos A. Paz De Araujo et al., particularly FIG. 25 and the discussion at col. 34, lines 28–33. The polarizability of a ferroelectric memory must be at least seven microcoulombs per centimeter squared ($\mu C/cm^2$) to make a practical memory. See, for example, European Patent Publication No. 0 489 519 A2, page 4, lines 3–7, and page 5, lines 7–10. As indicated in the Vest article and U.S. Pat. No. 5,519,234 references above, the polarizability of ferroelectric materials generally falls below this level when made less than 140 nanometers to 200 nanometers thick. Therefore, when utilizing thin films of ferroelectric materials, generally several coatings of ferroelectric material are made to build up the thickness to about 140 nanometers (1400 Å) or higher, so that the polarizability will be sufficiently high to make a memory. See U.S. Pat. No. 5,198,269, issued March 30, 1993, to Scott L. Swartz and Peter J. Melling.

An additional obstacle to fabricating dense ferroelectric memories has been the difficulty of making extremely thin films on commercially practical substrates. Generally, it has been found that the processing parameters, such as annealing temperatures, necessary to produce integrated circuit quality electronic devices also cause films less than about 100 nm to crack or othewise fail.

To increase the density of ferroelectric memories, it would be highly desirable to have a ferroelectric thin film with a polarizability greater than seven $\mu C/cm^2$ and a thickness significantly less than about 100 nm, and which can be fabricated using a commercially feasible process.

SUMMARY OF THE INVENTION

The present invention provides a nonvolatile ferroelectric memory having a comedically practical ferroelectric memory capacitor in which a thin film of ferroelectric material has a thickness of 90 nanometers or less. The invention also provides a method for fabricating such thin films. The method is a liquid deposition method in which a substrate is coated with precursor and then heated. Preferably, the temperatures of the various heating steps do not exceed 700° C., and the total heating time is less than two hours.

A feature of the invention, is a ferroelectric memory comprising a thin film of layered superlattice material having a thickness of 90 nanometers (hereinafter "nm") or less. In one embodiment of the invention, the thickness is less than 50 nanometers.

In one embodiment of the invention, the layered superlattice material comprises strontium, bismuth and tantalum. In this case, the material preferably includes u mole-equivalents of strontium, v mole-equivalents of bismuth, and w mole-equivalents of tantalum, where $0.8 \leq u \leq 1.0$, $2.0 \leq v \leq 2.3$, and $1.9 \leq w \leq 2.1$. Experiments have shown good results when u=0.9 and v=2.18. In another embodiment of the invention, the layered superlattice material comprises strontium, bismuth, tantalum and niobium. In this case, the material preferably includes u mole-equivalents of strontium, v mole-equivalents of bismuth, w mole-equivalents of tantalum, and x equivalents of niobium, where $0.8 \leq u \leq 1.0$, $2.0 \leq v \leq 2.3$, $1.9 \leq w \leq 2.1$, $1.9 \leq x \leq 2.1$ and $1.9 \leq (w+x) \leq 2.1$. In this case, preferably u=0.9, v=2.18.

The invention also provides a method of fabricating a thin film of a ferroelectric material having a thickness not exceeding 90 nm. The method includes: providing a substrate and a precursor containing metal moieties in effective amounts for spontaneously forming a layered superlattice material upon heating the precursor; applying the precursor to the substrate to form a coating; and heating the coating at a temperature not exceeding 700° C. for a total time not exceeding two hours to form a thin film of layered superlattice material on the substrate with a thickness of 90 nm or less.

In one aspect of the invention, the heating includes a step of baking the coating on the substrate at a temperature not exceeding 300° C. Another feature is that the step of baking is conducted for a time period not exceeding 15 minutes in an oxygen-enriched ambient. Typically, the oxygen-enriched ambient is oxygen gas (hereinafter "$O_2$ gas").

A feature of the invention is that heating comprises a step of rapid thermal processing the coating. The step of rapid thermal processing is conducted at a temperature not exceeding 700° C. In a preferred embodiment, the rapid thermal processing is conducted for 30 seconds with a ramping rate of 100° C. per second.

An important feature of the invention is that heating comprises a step of annealing the coating at a temperature not exceeding 700° C., preferably for a time period not exceeding one and one-half hours. In one embodiment of the invention, the annealing is conducted in an oxygen-enriched ambient, typically in $O_2$ gas. In another embodiment of the invention, the annealing is conducted in oxygen-free ambient, typically $N_2$ gas.

In one aspect of the invention, the substrate comprises a first electrode, and the method includes steps of forming a second electrode on the coating, after the step of annealing, to form a capacitor, and subsequently performing a step of post-annealing. In a preferred embodiment, the first electrode and the second electrode contain platinum and titanium. The step of post-annealing is conducted at a temperature not exceeding 700° C., preferably for a time period not exceeding 30 minutes. In one embodiment of the invention, the post-annealing is conducted in an oxygen-enriched ambient, typically in $O_2$ gas. In another embodiment of the invention, the post-annealing is conducted in oxygen-deficient ambient, typically $N_2$ gas.

In a preferred embodiment of the invention, an electrically conductive barrier layer is formed on the substrate prior to applying the precursor coating.

In a preferred embodiment of the inventive method, the heating comprises steps of baking the coating, rapid thermal processing the coating, annealing the coating, and post-annealing the coating. It is a feature of the invention that the total amount of time during which all of these heating steps are conducted does not exceed two hours.

In one embodiment, the thin film of layered superlattice material has a thickness not exceeding 90 nm. In another embodiment, the thin film has a thickness not exceeding 50 nm. In one embodiment, the layered superlattice material comprises strontium bismuth tantalate. Preferably, the corresponding precursor includes u mole-equivalents of strontium, v mole-equivalents of bismuth, and w mole-equivalents of tantalum, and $0.8 \leq w \leq 1.0$, $2.0 \leq v \leq 2.3$, and $1.9 \leq w \leq 2.1$. Ferroelectric capacitors, made according to the method of the invention using experimental precursor solutions in which u=0.9 and v=2.18, show good properties when the ferroelectric thin film has a thickness of either about 50 nm or 90 nm. In another embodiment, the layered superlattice material comprises strontium bismuth tantalum niobate. Preferably, the corresponding precursor includes u mole-equivalents of strontium, v mole-equivalents of bismuth, w mole-equivalents of tatalum, and x equivalents of niobium, and $0.8 \leq u \leq 1.0$, $2.0 \leq v \leq 2.3$, $1.9 \leq w \leq 2.1$, $1.9 \leq x \leq 2.1$ and $1.9 \leq (w+x) \leq 2.1$. Preferably, u=0.9 and v=2.18.

An important feature of the invention is baking the coating on the substrate at a temperature not exceeding 300° C. in an oxygen-enriched ambient, typically in $O_2$ gas.

Numerous other features, objects and advantages of the invention will become apparent from the following description when read in conjunction with the accompanying drawings.

BRIEF DESCRIPTION OF THE DRAWINGS

FIG. 2 is a flow chart showing the preferred embodiment of a process for fabricating a nonvolatile ferroelectric memory device according to the invention;

DETAILED DESCRIPTION OF THE PREFERRED EMBODIMENT

1. Overview

Figure 1:
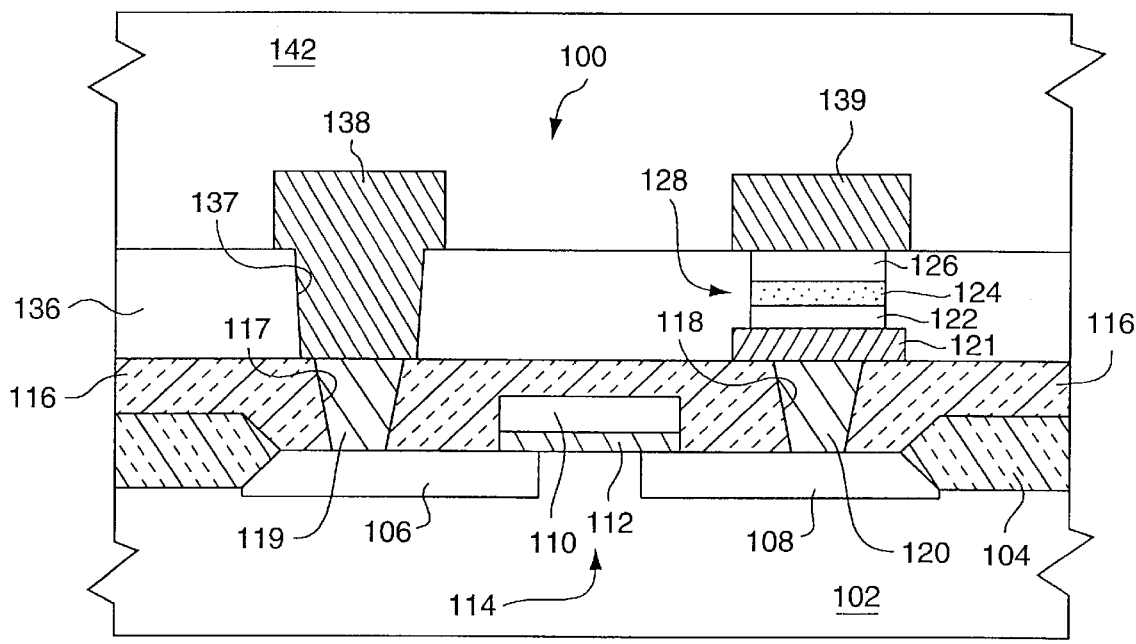
FIG. 1 is a schematic of a cross-sectional view of a portion of an integrated circuit having a nonvolatile ferroelectric memory cell according to the invention in which the ferroelectric capacitor is located above the switch.
Figure 3:
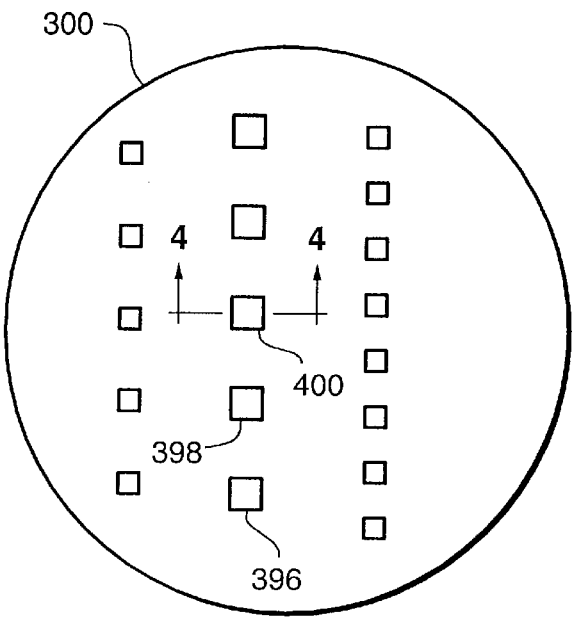
FIG. 3 is a top view of an exemplary wafer on which thin film capacitors fabricated in accordance with the invention are shown greatly enlarged.
Figure 4:
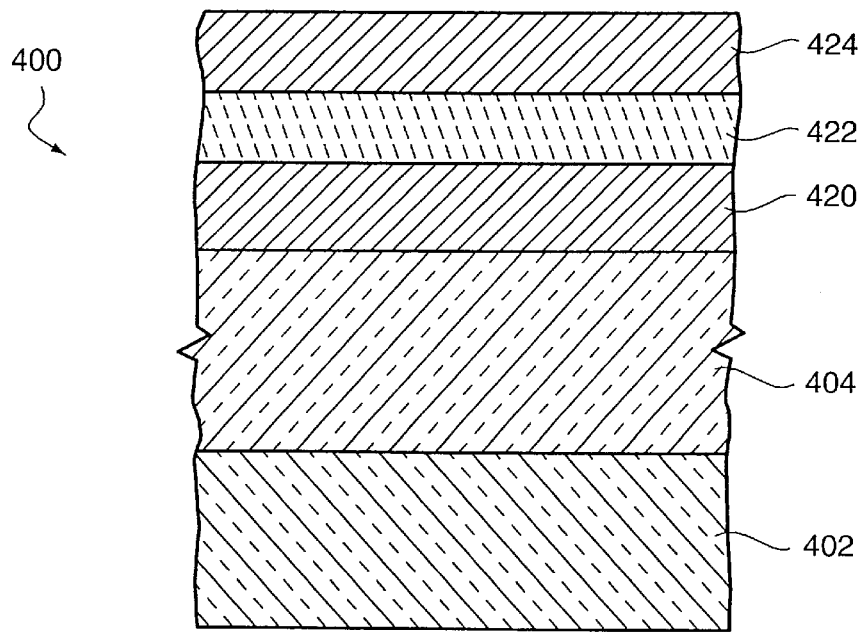
FIG. 4 is a portion of a cross-section of FIG. 3 taken through the lines 4—4, illustrating a thin film capacitor device fabricated in accordance with the invention.

It should be understood that the FIGS. 1, 3 and 4, depicting integrated circuit devices, are not meant to be actual plan or cross-sectional views of any particular portion of an actual integrated circuit device. In the actual devices, the layers will not be as regular and the thicknesses may have different proportions. The various layers in actual devices often are curved and possess overlapping edges. The figures, instead, show idealized representations which are employed to explain more clearly and fully the method of the invention than would otherwise be possible. Also, the figures represent only one of innumerable variations of ferroelectric devices that could be fabricated using the method of the invention. FIG. 1 depicts a ferroelectric memory containing a switch in the form of a field effect transistor in electrical connection with a ferroelectric capacitor. But, the method of this invention can also be used in a ferroelectric FET memory in which the ferroelectric element is incorporated in the switch element. Such a ferroelectric FET was described in McMillan, U.S. Pat. No. 5,523,964. Likewise, other integrated circuits fabricated using the method of the invention could include other elements and compositions of material.

FIG. 1 shows a cross-sectional view of a portion of an exemplary nonvolatile integrated circuit ferroelectric memory 100 that could be fabricated according to the invention. The general manufacturing steps for fabricating integrated circuits containing MOSFETs and ferroelectric capacitor elements are described in Mihara, U.S. Pat. No. 5,466,629 and Yoshimori, U.S. Pat. No. 5,468,684, which are hereby incorporated by reference as if fully disclosed herein. General fabrication methods have been described in other references also. Therefore, the elements of the circuit of FIG. 1 will be simply identified here.

In FIG. 1, a field oxide region 104 is formed on a surface of a silicon substrate 102. A source region 106 and a drain region 108 are formed separately from each other within silicon substrate 102. A gate insulating layer 110 is formed on the silicon substrate 104 between the source and drain regions 106 and 108. Further, a gate electrode 112 is formed on the gate insulating layer 110. These source region 106, drain region 108, gate insulating layer 110 and gate electrode 112 together form a MOSFET 114.

A first interlayer dielectric layer (ILD) 116 made of BPSG (boron-doped phosphosilicate glass) is formed on substrate 104 and field oxide region 102. ILD 116 is patterned to form vias 117, 118 to source region 106 and drain region 108, respectively. Vias 117, 118 are filled to form plugs 119, 120, respectively. Plugs 119, 120 are electrically conductive and typically comprise polycrystalline silicon. A diffusion barrier layer 121 is formed and patterned on ILD 116 to be in electrical contact with plug 120. The diffusion barrier layer 121 is made of, for example, titanium nitride, and typically has a thickness of 10–20 nm. Diffusion barrier layers, such as titanium nitride, inhibit the diffusion of chemical species between the underlying and overlying layers of the memory 100.

As depicted in FIG. 1, a bottom electrode layer 122 made of platinum and having a thickness of 90 nm is deposited on diffusion barrier layer 121. Then a ferroelectric thin film 124 is formed on bottom electrode layer 122. According to the invention, the thickness of ferroelectric thin film 124 does not exceed 90 nm. Most preferably, it is 50 nanometers or less. A top electrode layer 126, made of platinum and having a thickness of 90 nm, is formed on the ferroelectric thin film 124. Bottom electrode layer 122, ferroelectric thin film 124 and top electrode layer 126 together form ferroelectric capacitor 128. The composition of ferroelectric thin film 124 is discussed in more detail below.

Wafer substrate 102 may comprise silicon, gallium arsenide or other semiconductor, or an insulator, such as silicon dioxide, glass or magnesium oxide (MgO). The bottom and top electrodes of ferroelectric capacitors conventionally contain platinum. It is preferable that the bottom electrode contains a non-oxidized precious metal such as platinum, palladium, silver, and gold. In addition to the precious metal, metal such as aluminum, aluminum alloy, aluminum silicon, aluminum nickel, nickel alloy, copper alloy, and aluminum copper may be used for electrodes of a ferroelectric memory. Adhesive layers (not shown), such as titanium, enhance the adhesion of the electrodes to adjacent underlying or overlying layers of the circuits.

A second interlayer dielectric layer (ILD) 136 made of NSG (nondoped silicate glass) is deposited to cover ILD 116, diffusion barrier layer 121, and ferroelectric capacitor 128. A PSG (phospho-silicate glass) film or a BPSG (boron phospho-silicate glass) film could also be used in layer 136.

ILD 136 is patterned to form a via 137 to plug 119. A metallized wiring film is deposited to cover ILD 136 and fill via 137 and then patterned to form plug 137, source electrode wiring 138, and top electrode wiring 139. Wirings 138, 139 preferably comprise Al—Si—Cu standard interconnect metal with a thickness of about 200–300 nm.

FIG. 1 depicts only one of many variations of ferroelectric memory cells that can use the structure and method of the invention. For example, although the ferroelectric element depicted in FIG. 1 is substantially above the switch element, the invention may include a thin film of layered superlattice material in a ferroelectric capacitor displaced to the side of the switch. Also, the structure and the low-temperature method of the invention may be applied to ferroelectric memories in which the electrically conductive diffusion barrier layer functions both as a diffusion barrier and as an electrode of the capacitor. Or the structure and method of the invention may be used in circuits that contain no diffusion barrier layer under the ferroelectric thin film. Or the memory may utilize a ferroelectric FET, such as the memory shown in U.S. Pat. No. 5,523,964 issued to McMillan et al., which is incorporated by reference herein as though fully contained herein.

The ferroelectric thin film 124 is preferably a layered superlattice material, but also may be an $ABO_3$ type material or other ferroelectric material. The ferroelectric material 124 is incorporated into an active component in the integrated circuit portion 100. An active component of an integrated circuit memory is a component that is actively involved in the memory function, as contrasted to a component, such as insulator 136 which serves only to separate active components from one another.

U.S. Pat. No. 5,519,234 issued May 21, 1996, incorporated herein by reference, discloses that layered superlattice compounds, such as strontium bismuth tantalate ("SBT"), have excellent properties in ferroelectric applications as compared to the best prior art materials, and have high dielectric constants and low leakage currents.

The materials of the invention work well in the polycrystalline state. In the polycrystalline state, the structure of the materials includes grain boundaries, point defects, dislocation loops and other microstructure defects.

The layered superlattice materials may be summarized generally under the formula:

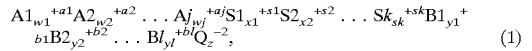

$$A1_{w1}^{+a1}A2_{w2}^{+a2}\ldots Aj_{wj}^{+aj}S1_{x1}^{+s1}S2_{x2}^{+s2}\ldots Sk_{sk}^{+sk}B1_{y1}^{+b1}B2_{y2}^{+b2}\ldots Bl_{yl}^{+bl}Q_z^{-2}, \quad (1)$$

where A1, A2 ... Aj represent A-site elements in the perovskite-like structure, which may be elements such as strontium, calcium, barium, bismuth, lead, and others; S1, S2 ... Sk represent superlattice generator elements, which usually is bismuth, but can also be materials such as yttrium, scandium, lanthanum, antimony, chromium, thallium, and other elements with a valence of +3; B1, B2 ... Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $SrBi_2(Ta_{0.75}N_{0.25})_2O_9$, on the average, 75% of the B-sites are occupied by a tantalum atom and 25% of the B-sites are occupied by a niobium atom. If there is only one A-site element in the compound, then it is represented by the "A1" element and w2 ... wj all equal zero. If there is only one B-site element in the compound, then it is represented by the "B1" element, and y2 ... yl all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

$$(a1w1+a2w2 \ldots +ajwj)+(s1 \times 1+s2 \times 2 \ldots +skxk)+(b1y1+b2y2 \ldots +blyl)=2z \quad (2)$$

Formula (1) includes all three of the Smolenskii type compounds discussed in U.S. Pat. No. 5,519,234 issued May 21, 1996, which is hereby incorporated by reference as if fully incorporated herein. The layered superlattice materials do not include every material that can be fit into the formula (1), but only those which spontaneously form themselves into crystalline structures with distinct alternating layers.

The word "substrate" can mean the underlying wafer 102 on which the integrated circuit is formed, as well as any object on which a thin film layer is deposited, such as BPSG layer 116. In this disclosure, "substrate" shall mean the object to which the layer of interest is applied; for example, when we are talking about a bottom electrode, such as 122, the substrate includes the layers 121 and 116 on which the electrode 122 is formed.

The term "thin film" is used herein as it is used in the integrated circuit art. Generally, it means a film of less than a micron in thickness. The ferroelectric thin films disclosed herein in all instances have a thickness not exceeding 0.09 microns, or 90 nanometers. Preferably, the ferroelectric thin film 124 is 30 nm to 90 nm thick. These thin films of the integrated circuit art should not be confused with the layered capacitors of the macroscopic capacitor art, which are formed by a wholly different process that is incompatible with the integrated circuit art.

The term "stoichiometric" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2(TaNb)O_9$, and $SrBi_2(Ta_{1.5}Nb_{0.5})O_9$ are balanced stoichiometric formulae. In contrast, a precursor for strontium bismuth tantalum niobate in which the molar proportions of strontium, bismuth, tantalum, and niobium are 0.9, 2.18, 1.5, and 0.5, respectively, is represented herein by the unbalanced "stoichiometric" formula $Sr_{0.9}Bi_{2.18}(Ta_{1.5}Nb_{0.5})O_9$, since it contains excess bismuth and deficient strontium relative to the B-site elements tantalum and niobium. In this disclosure, an "excess" amount of a metallic element means an amount greater than required to bond with the other metals present to make a completed crystalline structure of the desired material, with all atomic sites occupied and no amount of any metal left over. A "deficient" amount of a metallic element means an amount less than required to bond with the other metals if the other metals were present in stoichiometrically balanced amounts.

2. Description of Preferred Method of Fabrication

The diagram of FIG. 2 is a flow sheet of the fabrication steps of the process 210 including the method of this invention to make a ferroelectric memory as depicted in FIG. 1. In step 212, a semiconductor substrate is provided on which a switch is formed in step 214. The switch is typically a MOSFET. In step 216, an insulating layer is formed to separate the switching element from the ferroelectric element to be formed. Using conventional processes, the insulating layer is patterned to form vias, which are filled with conductive plugs to electrically connect the switch to the memory capacitor and the rest of the integrated circuit. In step 218, a diffusion barrier layer is deposited on the insulating layer and patterned. Preferably the diffusion barrier comprises titanium nitride and has a thickness of about 10–20 nm. Preferably, the diffusion barrier is deposited by a conventional sputtering method, using a titanium nitride target, although a titanium target with a nitrogen-containing sputter gas may also be used. In step 220, a bottom electrode is formed. Preferably, the electrode is made of platinum and is sputter-deposited to form a layer with a thickness of about 90 nm. The precursor for forming the ferroelectric thin film of layered superlattice material is applied to the bottom electrode in step 224. In the method of the invention, the precursor is applied using a liquid deposition technique, such as a misted deposition method as described in U.S. Pat. No. 5,456,945, or a spin-coating method. In step 222, chemical precursors of the layered superlattice material that will form the desired ferroelectric thin film are prepared. Usually, precursor solutions are prepared from commercially available solutions containing the chemical precursor compounds. But, for example, in preferred embodiment of the inventive device and method, a liquid precursor solution contains relative molar proportions of the elements strontium, bismuth, and tantalum corresponding approximately to the formula $Sr_{0.9}Bi_{2.18}Ta_2O_9$. Therefore, if necessary, the concentrations of the various precursors supplied in the commercial solutions are adjusted in step 222 to accommodate particular manufacturing or operating conditions. According to the invention, a liquid coating of precursor solution is applied to the substrate in step 224. In the examples below, the substrate was spun at 1500–2000 rpm for 30 seconds. In baking step 226, the coating of liquid precursor is baked and dried at a temperature not exceeding 300° C. Preferably, the baking step is conducted on a hot plate in $O_2$ gas, or at least in an oxygen-enriched ambient, for a time period not exceeding 15 minutes. The term "oxygen-enriched" means that the relative amount of oxygen present is in excess of the amount of oxygen present in air.

Then, in step 228, the dried coating on the substrate is subjected to rapid thermal processing ("RTP"). The RTP is conducted at a temperature not exceeding 700° C. Preferably, the RTP is conducted for 30 seconds with a ramping rate of 100° C. per second. Radiation from a halogen lamp, an infrared lamp, or an ultraviolet lamp provides the source of heat for the RTP bake step. In the examples below, an AG Associates model 410 Heat Pulser utilizing a halogen source was used. Preferably, the RTP process is performed in $O_2$ gas, or at least in an oxygen-enriched ambient. Any residual organics are burned out and vaporized during the RTP process. At the same time, the rapid temperature rise of the RTP promotes nucleation; that is, the generation of numerous crystalline grains of the layered superlattice material in the solid film 30. These grains act as nuclei upon which further crystallization can occur. The presence of oxygen in the bake process is essential in forming these grains.

In annealing step 230, the coating is annealed at a temperature not exceeding 700° C. to form the thin film of layered superlattice material. The annealing time does not exceed one and one-half hours. Preferably, the annealing time is about 60 minutes. The anneal is typically performed in a furnace containing an $O_2$ gas ambient, but good experimental results were also obtained using an oxygen-free $N_2$ gas ambient. The annealing step can also be conducted in air, in an oxygen-enriched ambient, or in an "oxygen-deficient" ambient, in which the relative amount of oxygen is less than the relative amount of oxygen in air.

The sequence of steps 224–230 may be conducted a second time (indicated by the dashed flowline in FIG. 2) to achieve the desired quality and thickness of the ferroelectric thin film of the invention. Depending on the thickness of the initial coating, the thickness of the thin film after one sequence of steps 224–230 ranges between 40 nm and 90 nm. Preferably, two sequences of steps 224–230, each sequence forming a layer with a thickness of 40–50 nm, are used to form a ferroelectric thin film with a total thickness of 80–90 nm. For process-economical reasons, however, it might be desirable to form a thin film of 80–90 nm thickness using one sequence of steps 224–230. Or, for example, to increase circuit density, it might be preferable to use one sequence of steps 224–230 to form a thin film having a thickness in the range of 40–50 nm.

Following steps 224–230, the top electrode is formed in step 232. Preferably, the electrode is formed by RF sputtering of a platinum single layer, but it also may be formed by DC sputtering, ion beam sputtering, vacuum deposition or other appropriate deposition process. If desirable for the electronic device design, before the metal electrode deposition, the ferroelectric layered superlattice material may be patterned using conventional photolithography and etching, and the top electrode is then patterned in a second process after deposition. In the examples described below, the top electrode and layered superlattice material are patterned together using conventional photolithography techniques and ion beam milling.

In step 234, post-annealing is performed at a temperature not exceeding 700° C. Preferably, post-annealing step 234 is performed for a time period not exceeding 30 minutes. Post-annealing step 234 may be performed in $O_2$ gas or in $N_2$ gas or in mixtures of the two gases, such as air. As deposited, the adhesion of the top electrode to the thin film of layered superlattice material is usually weak. The adhesion is improved by post-annealing. The post-anneal is preferably performed in an electric furnace at a temperature between 500° C. and the first anneal temperature, which does not exceed 700° C. A post-anneal below 500° C. does not improve the adhesion of the electrode, and the resulting capacitor devices would tend to be extremely leaky, and shorted-circuited in the worst cases.

The post-anneal releases the internal stress in the top electrode and in the interface between electrode and the ferroelectric thin film. At the same time, the post-annealing step 234 reconstructs microstructure in the layered superlattice material resulting from the sputtering of the top electrode, and as a result improves the properties of the material. The effect is the same whether the post-anneal is performed before or after the patterning steps mentioned in connection with step 236 below. The effect of oxygen ambient during the post-anneal is not as clear as it is in RTP step 228 and anneal step 230 because the layered superlattice material is covered by the top electrode and not exposed to the ambient atmosphere. With regard to most electrical properties, inert gas, such as helium, argon, and nitrogen, may be used with approximately the same result as with oxygen. Nevertheless, it has been found that an oxygen ambient during the post-anneal improves the crystallographic order at the interface of the top electrode and the ferroelectric thin film, as well as the symmetry of the hysteresis curve.

The circuit is generally completed in step 236, which can include a number of substeps; for example, deposition of an ILD, patterning and milling, and deposition of wiring layers.

An important feature of the inventive method is that the total time of each complete sequence of the various heating steps 226, 228, 230 and 234 does not exceed two hours.

FIG. 3 is a top view of an exemplary wafer on which thin film capacitors 396, 398 and 400 fabricated on substrate 300 in accordance with the invention are shown greatly enlarged. FIG. 4 is a portion of a cross-section of FIG. 3 taken through the lines 4—4, illustrating a thin film capacitor device fabricated in accordance with the invention. A silicon dioxide layer 404 is formed on a silicon crystal substrate 402. Then bottom electrode 422 made of platinum is sputter-deposited on layer 404. Layer 424 is a ferroelectric thin film, and layer 426 represents the top electrode made of platinum.

In the examples below, the ferroelectric and electronic properties of strontium bismuth tantalate capacitors made according to the invention were studied by measuring hysteresis curves, polarizability, leakage current, saturation voltage, fatigue behavior and percentage imprint.

EXAMPLE 1

The capacitors were fabricated from a strontium bismuth tantalate (SBT) liquid precursor solution commercially available from the Kojundo Chemical Corporation. The solution contained amounts of chemical precursors corresponding to the stoichiometric formula $Sr_{0.9}Bi_{2.18}Ta_2O_9$. The 0.12 mol/l precursor solution contained: bismuth 2-ethylhexanoate, strontium 2-ethylhexanoate, and tantalum 2-ethylhexanoate. The capacitors were formed using one sequence of precursor application and heating steps, and the ferroelectric thin films had a thickness of about 90 nm.

A series of p-type 100 Si wafer substrates 402 were oxidized to form a layer of silicon dioxide 404. A bottom platinum electrode 422 with a thickness of about 200 nm was sputter-deposited on oxide layer 404. These were annealed 30 minutes in $O_2$ at 650° C., and dehydrated 30 minutes at 180° C. in low vacuum. A spincoat of the 0.12 molar solution of the SBT-precursor was deposited on the bottom electrode 422 at 1800 rpm for 30 seconds. This was dehydrated by baking on a hot plate in $O_2$ gas for one minute at 160° C., followed by four minutes at 260° C. The coating was crystallized using rapid-thermal-processing (RTP) at 675° C. for 30 seconds in $O_2$ gas, with a ramping rate of 100° C. per second. The wafer and deposited coating were annealed for 60 minutes at 700° C. in $O_2$ gas. These steps formed a ferroelectric thin film 424 having a thickness of about 90 nm. Platinum was sputter-deposited to make a top electrode layer 426 with a thickness of about 200 nm. The platinum and strontium bismuth tantalate layers were milled to form the capacitors, and then ashing was performed, followed by a post-anneal for 30 minutes at 700° C. in $O_2$ gas. The capacitors had a surface area of 7854 $\mu m^2$.

Figure 7:
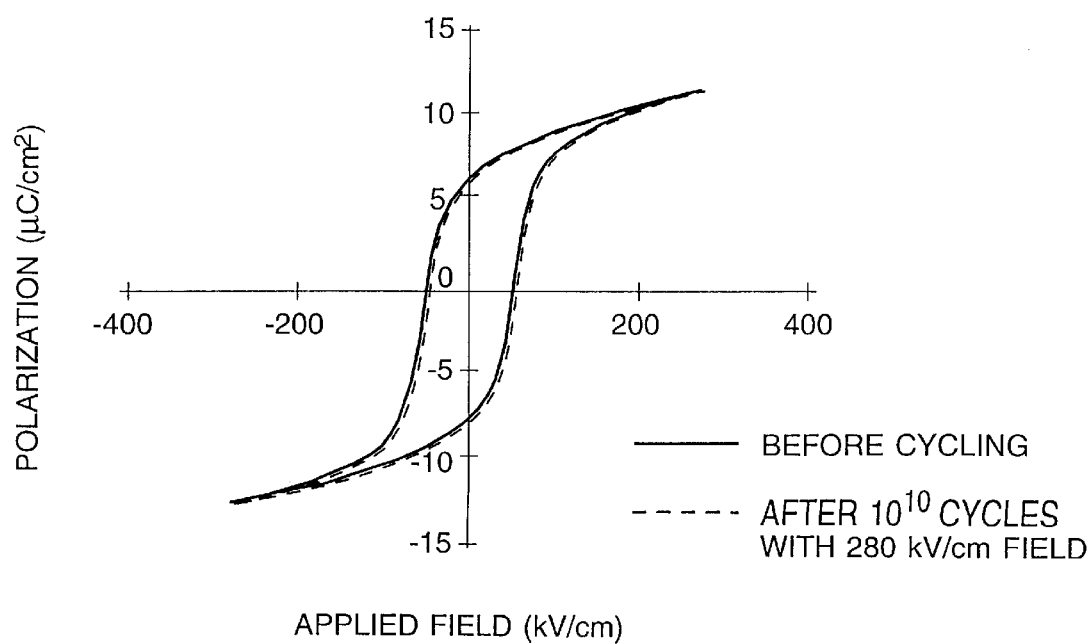
FIG. 7 is a graph of the polarization, in units of $\mu C/cm^2$, plotted as a function of applied field, kV/cm, before fatigue cycling and after $10^{10}$ square-wave cycles in a field of 280 kV/cm, measured in the capacitor of FIGS. 5 and 6.
Figure 5:
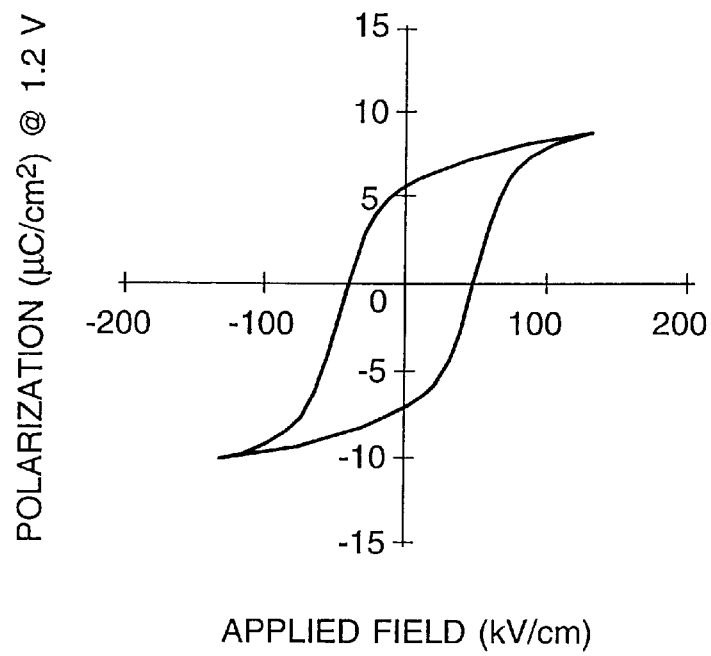
FIG. 5 shows the hysteresis curve of a representative sample capacitor measured at 1.2 volts, plotted on a graph of the polarization value, in units of $\mu C/cm^2$, as a function of applied field, in units of kV/cm, in which the thin film of layered superlattice material has a thickness of 90 nm.
Figure 6:
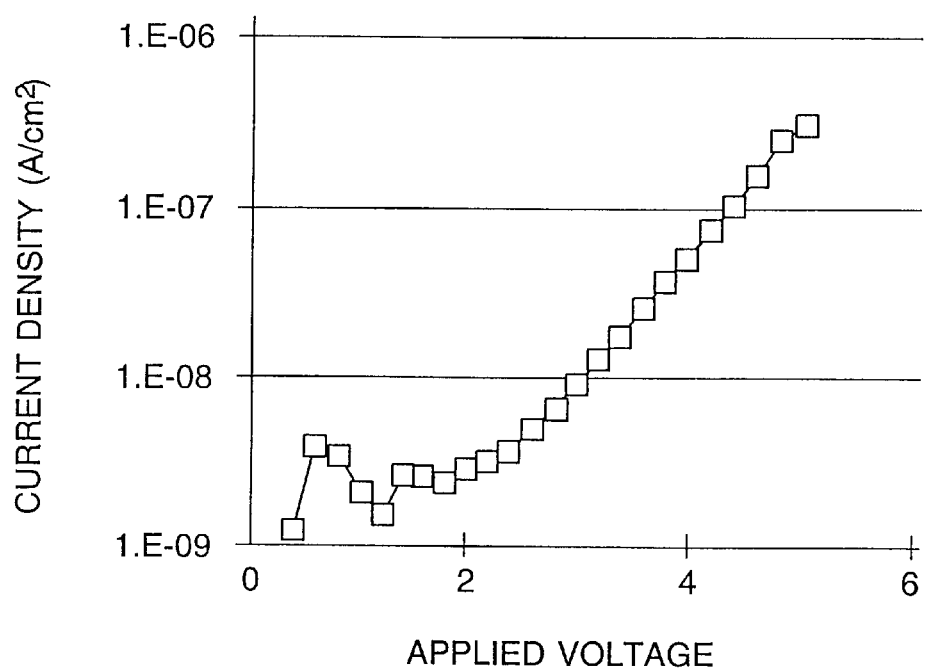
FIG. 6 is a graph of leakage current, in units $A/cm^2$, plotted as a function of applied voltage, measured in the sample capacitor of FIG. 5.

FIG. 5 shows the hysteresis curve of a representative sample capacitor measured at 1.2 volts, plotted on a graph of the polarization value, in units of $\mu C/cm^2$, as a function of applied field, in units of kV/cm. The hysteresis curve was at the saturation voltage, above which voltage remnant polarization, Pr, does not increase more than about ten percent even as voltage is increased without limit. At the saturation voltage of 1.2 volts, therefore, the 2Pr-value was about 13 $\mu C/cm^2$. When measured at 5 volts, the 2Pr-value was about 15 $\mu C/cm^2$. FIG. 6 is a graph of current density measured in the capacitor, in units $A/cm^2$, plotted as a function of applied voltage. FIG. 6 shows that, at 3 volts, the leakage current was less than $10^{-8}$ A/cm$^2$, and at 5 volts, it was still less than $10^{-6}$ A/cm$^2$. FIG. 7 shows the fatigue behavior of the sample capacitor. FIG. 7 is a graph of the polarization, in units of $\mu$C/cm$^2$, plotted as a function of applied field, kV/cm, before fatigue cycling and after $10^{10}$ square-wave cycles in a field of 280 kV/cm. The before and after curves are indistinguishable, indicating that the fatigue is less than one percent after $10^{10}$ cycles. The percentage imprint after $10^9$ cycles at 85° C. and measured at 85° C. was about 20 percent.

EXAMPLE 2

Strontium bismuth tantalate capacitors were prepared as in Example 1, also using only one spin-coating of precursor and, therefore, only one sequence of spincoating, baking, RTP and annealing steps. But, in this second example, the final ferroelectric thin film had a measured thickness of only 47.5 nm. Also, the hot-plate bake was performed at 160° C. for one minute, as in Example 1, but then at 260° C. for only two minutes, instead of four minutes. Measurements were performed similar to those conducted with the capacitors of Example 1.

Figure 8:
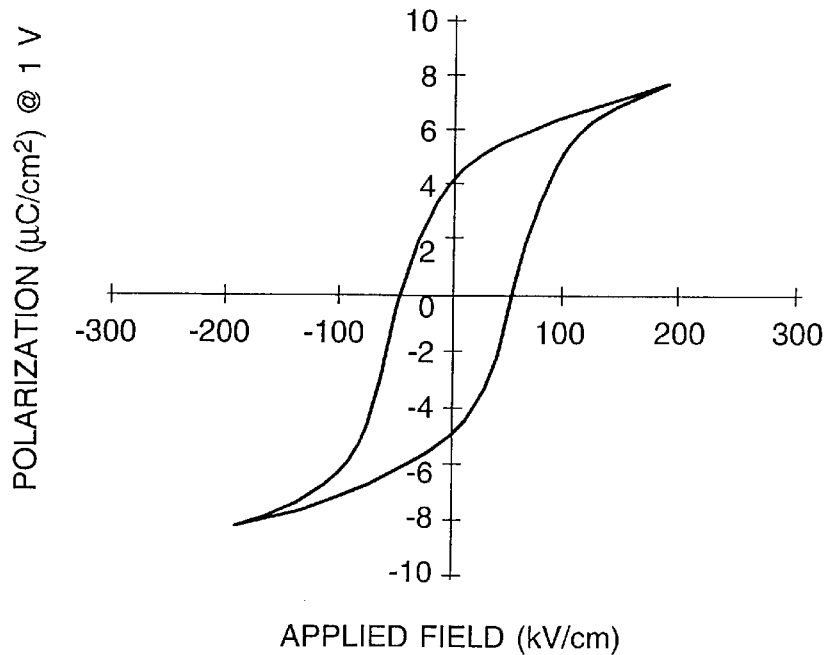
FIG. 8 shows the hysteresis curve of a representative sample capacitor measured at one volt, plotted as a graph of the polarization value, in units of $\mu C/cm^2$, as a function of applied field, in units of kV/cm, in which the thin film of layered superlattice material has a thickness of 47.5 nm.
Figure 9:
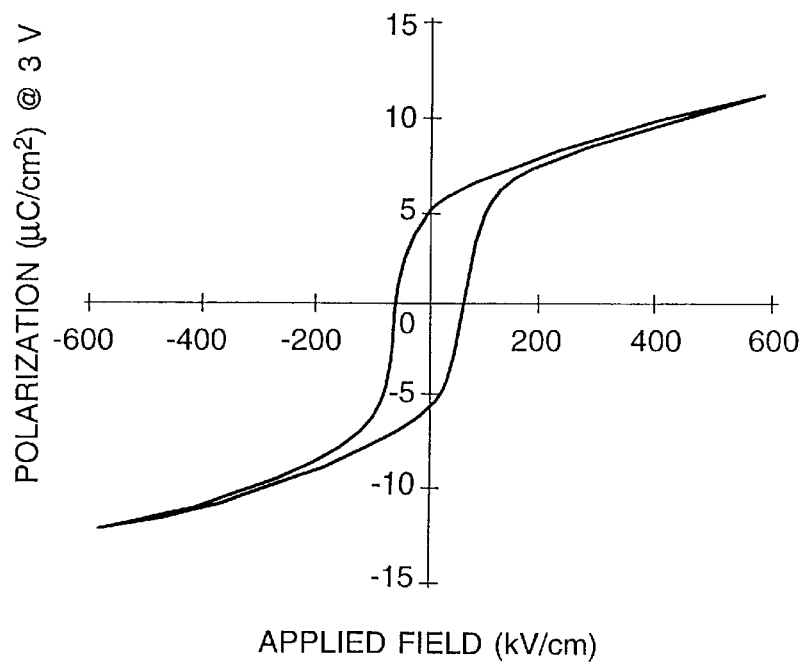
FIG. 9 shows the hysteresis curve of the capacitor measured at three volts, plotted as a graph of the polarization value, in units of $\mu C/cm^2$, as a function of applied field, in units of kV/cm.
Figure 10:
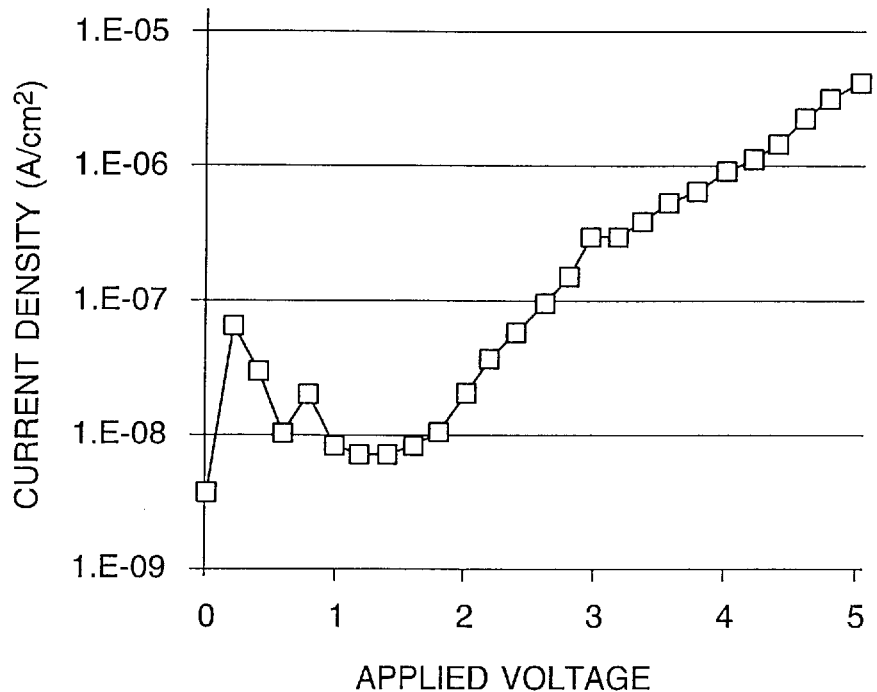
FIG. 10 is a graph of leakage current, in units $A/cm^2$, plotted as a function of applied voltage.
Figure 11:
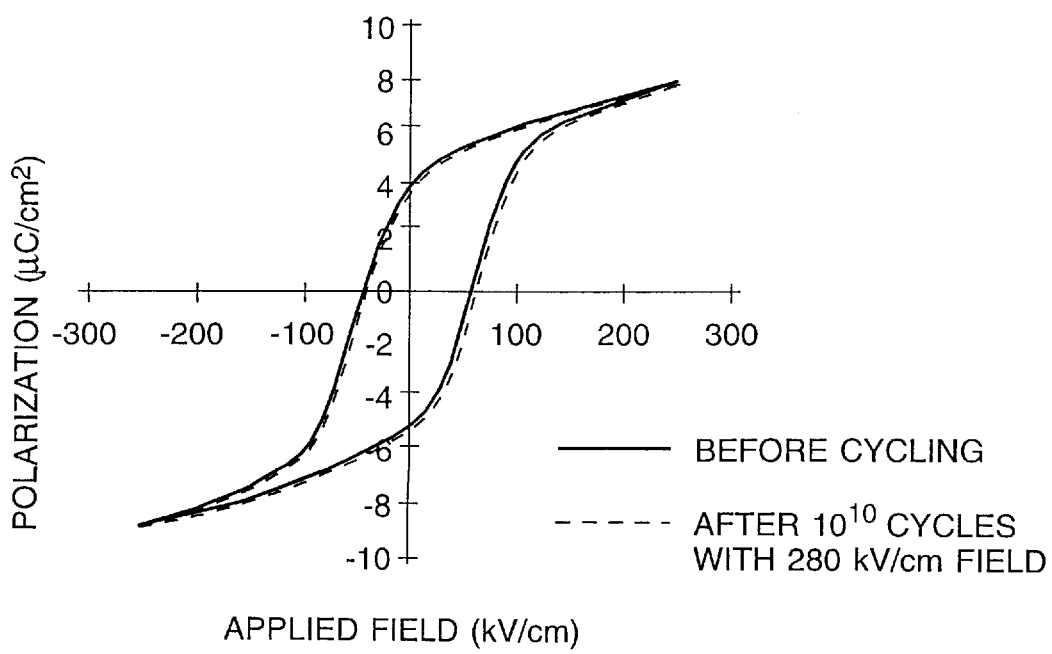
FIG. 11 is a graph of the polarization, in units of $\mu C/cm^2$, plotted as a function of applied field, kV/cm, before fatigue cycling and after $10^{10}$ square-wave cycles in a field of 280 kV/cm.

FIG. 8 shows the hysteresis curve of a representative sample capacitor measured at one volt, plotted as a graph of the polarization value, in units of $\mu$C/cm$^2$, as a function of applied field, in units of kV/cm. At one volt, the 2Pr-value, expressed in units of $\mu$C/cm$^2$, was about 9 $\mu$C/cm$^2$. FIG. 9 shows the hysteresis curve of the capacitor measured at 3 volts, plotted as a graph of the polarization value, in units of $\mu$C/cm$^2$, as a function of applied field, in units of kV/cm. At 3 volts, the 2Pr-value, expressed in units of $\mu$C/cm$^2$, was about 11 $\mu$C/cm$^2$. FIG. 10 is a graph of current density, in units A/cm$^2$, plotted as a function of applied voltage. At 3 volts, the leakage current in the capacitor was about $3\times10^{-7}$ A/cm$^2$, and at 5 volts, it was about $5\times10^{-6}$ A/cm$^2$. FIG. 11 shows the fatigue behavior of the sample capacitor. FIG. 11 is a graph of the polarization, in units of $\mu$C/cm$^2$, plotted as a function of applied field, kV/cm, before fatigue cycling and after $10^{10}$ square-wave cycles in a field of 280 kV/cm. The before and after curves are indistinguishable, indicating that the fatigue is less than one percent after $10^{10}$ cycles.

EXAMPLE 3

Strontium bismuth tantalate capacitors were prepared as in Example 2, except that two spin-coatings were used to form the thin film of layered superlattice material. The sequence of spin-coating, baking, RTP and annealing steps was conducted two times, each sequence depositing a film about 40 nm thick. The final ferroelectric thin film had a thickness of about 85 nm, comparable to the thickness of the thin film in Example 1. In contrast to Examples 1 and 2, the annealing step and the post-annealing step were conducted in $N_2$ gas (instead of $O_2$ gas). Measurements were performed similar to those conducted with the capacitors of Example 1.

The 2Pr-value measured at 5 volts in a sample capacitor was 18 $\mu$C/cm$^2$. The coercive field, 2Ec, measured at 5 volts was 96 kV/cm. The leakage current measured in a field of 300 kV/cm was $7\times10^{-9}$ A/cm$^2$. The saturation voltage was about one volt. After $10^{10}$ square-wave cycles with 280 kV/cm field, the measured fatigue was about three percent. The percentage imprint after $10^9$ cycles at 85° C. and measured at 85° C. was about 20 percent.

Other experiments have suggested that integrated circuit quality thin films of ferroelectric material with a thickness not exceeding 90 nm cannot be made with the yield rates required to be commercially competitive using a conventional high-temperature process; that is, a process with heating temperatures of 800° C. or higher. Capacitors having such thin films made at high temperature have a high probability of short-circuiting.

There has been described a ferroelectric memory device containing a thin film of ferroelectric layered superlattice material with a thickness not exceeding 90 nanometers and having good electronic properties and increased density. There has also been described a low-temperature method for fabricating the ferroelectric thin film of the invention. In contrast to the teaching of the prior art, the process heating temperature in the inventive method never exceeds 700° C., and the total heating time does not exceed two hours. This low temperature process has been found to be particularly effective for obtaining high yields of extremely thin films in commercial fabrication settings. It should be understood that the particular embodiments shown in the drawings and described within this specification are for purposes of example and should not be construed to limit the invention, which will be described in the claims below. Further, it is evident that those skilled in the art may now make numerous uses and modifications of the specific embodiments described, without departing from the inventive concepts. For example, now that a ferroelectric memory has been disclosed containing a ferroelectric thin film with a thickness not exceeding 90 nm and good electronic properties, the thin film can be combined with other structures to provide variations on the device described. Similarly, now that a low-temperature method for fabricating thin films of layered superlattice materials has been disclosed as a viable part of the process for fabricating extremely thin ferroelectric memory devices, variations on the method described may be made. It is also evident that the steps recited may in some instances be performed in a different order; or equivalent structures and processes may be substituted for the various structures and processes described. Consequently, the invention is to be construed as embracing each and every novel feature and novel combination of features present in and/or possessed by the fabrication processes, electronic devices, and electronic device manufacturing methods described.

We claim:

1. A ferroelectric integrated circuit memory cell comprising: a ferroelectric memory element including a polycrystalline ferroelectric thin film and an electrode for applying an electric field to said ferroelectric thin film, said ferroelectric thin film having a thickness of 90 nanometers or less.

2. A ferroelectric memory cell as in claim 1, wherein said thickness is 50 nanometers or less.

3. A ferroelectric memory cell as in claim 1, wherein said ferroelectric thin film has a polarizability greater than 7 $\mu$C/cm$^2$.

4. A ferroelectric memory cell as in claim 1, wherein said ferroelectric thin film comprises a layered superlattice material.

5. A ferroelectric memory as in claim 4, wherein said layered superlattice material comprises strontium, bismuth and tantalum.

6. A ferroelectric memory as in claim 4, wherein said layered superlattice material includes u mole-equivalents of strontium, v mole-equivalents of bismuth, and w mole-equivalents of tantalum, and $0.8 \leq u \leq 1.0$, $2.0 \leq v \leq 2.3$, and $1.9 \leq w \leq 2.1$.

7. A ferroelectric memory as in claim 3, wherein said layered superlattice material comprises strontium, bismuth, tantalum and niobium.

8. A ferroelectric memory as in claim 7, wherein said layered superlattice material includes u mole-equivalents of strontium, v mole-equivalents of bismuth, w mole-equivalents of tantalum, and x equivalents of niobium, and $0.8 \leq u \leq 1.0$, $2.0 \leq v \leq 2.3$, $1.9 \leq w \leq 2.1$, $1.9 \leq x \leq 2.1$ and $1.9 \leq (w+x) \leq 2.1$.

9. A ferroelectric integrated circuit memory cell comprising: a ferroelectric memory element including a ferroelectric thin film and an electrode for applying an electric field to said ferroelectric thin film, said ferroelectric thin film comprising a layered superlattice material having a thickness of 90 nanometers or less.

10. A ferroelectric memory cell as in claim 9, wherein said thickness is 50 nanometers or less.

11. A ferroelectric memory cell as in claim 9, wherein said ferroelectric thin film has a polarizability greater than 7 $\mu C/cm^2$.

* * * * *

UNITED STATES PATENT AND TRADEMARK OFFICE
CERTIFICATE OF CORRECTION

PATENT NO. : 6,104,049
DATED : August 15, 2000
INVENTOR(S) : Narayan Solayappan, et al.

It is certified that error appears in the above-identified patent and that said Letters Patent is hereby corrected as shown below:

Title page,
Item 73 Assignee, replace "Symetrix Corporation, Colorado Springs, Colo." with -- Symetrix Corporation, Colorado springs, Colo., and Matsushita Electronics Corporation, Japan --.

Signed and Sealed this

Twenty-eighth Day of August, 2001

*Attest:*

NICHOLAS P. GODICI
*Attesting Officer*  *Acting Director of the United States Patent and Trademark Office*